United States Patent
Jang (10) Patent No.: US 6,635,504 B2
(45) Date of Patent: Oct. 21, 2003

(54) METHOD OF MANUFACTURING ORGANIC EL DISPLAY

(75) Inventor: Keun Ho Jang, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 8 days.

(21) Appl. No.: 10/036,517

(22) Filed: Jan. 7, 2002

(65) Prior Publication Data

US 2002/0127753 A1 Sep. 12, 2002

(30) Foreign Application Priority Data

Mar. 7, 2001 (KR) .......................... 2001-11822

(51) Int. Cl.[7] .............................................. H01L 21/00
(52) U.S. Cl. ........................................ 438/28; 438/47
(58) Field of Search .......................... 438/82, 99, 28, 438/29, 45, 47; 257/40

(56) References Cited

U.S. PATENT DOCUMENTS

| | | | |
|---|---|---|---|
| 6,445,005 B1 | * | 9/2002 | Yamazaki et al. ............. 257/72 |
| 2001/0011726 A1 | * | 8/2001 | Hayashi et al. ................ 257/59 |
| 2002/0011785 A1 | * | 1/2002 | Tang et al. ................... 313/506 |
| 2002/0146893 A1 | * | 10/2002 | Shimoda et al. ............ 438/458 |
| 2003/0064552 A1 | * | 1/2003 | Tanaka et al. ............... 438/163 |

* cited by examiner

Primary Examiner—Carl Whitehead, Jr.
Assistant Examiner—William C Vesperman (57) ABSTRACT

A method of manufacturing a CMOS thin film transistor (TFT) active matrix organic EL device using six mask processes. The manufacturing methods is simpler than previous manufacturing methods, resulting in high manufacturing yield and low production cost.

15 Claims, 7 Drawing Sheets

METHOD OF MANUFACTURING ORGANIC EL DISPLAY

CROSS-REFERENCE TO RELATED APPLICATIONS

This application claims the benefit of Korean Patent Application No. 2001-11822, filed on Mar. 7, 2001, the entirety of which is hereby incorporated by reference.

BACKGROUND OF THE INVENTION

1. Field of the Invention

The present invention relates to an organic EL display, and more particularly, to a method of manufacturing a CMOS thin film transistor active matrix organic EL display.

2. Description of the Related Art

Recently, an organic EL display (OELD) receives attention as a flat panel display device because it has many advantages over other displays such as an LCD and a CRT. For example, the OELD is thin, lightweight and has low power consumption in comparison to the LCD and the CRT.

The OELDs are divided roughly into two types according to its driving method: active matrix (AM) type; and passive matrix (PM) type. Due to low current density and high luminous efficiency, the AM-OELD is studied by many groups.

A manufacturing process of the AM-OELD is very complicated. For example, in case of a coplanar CMOS TFT AM-OELD, eight mask processes, except the mask process for channel doping and Lightly Doped Drain (LDD) structure, are required to manufacture the CMOS TFT AM-OELD. Therefore, manufacturing yield is low, and production cost is high.

SUMMARY OF THE INVENTION

To overcome the problems described above, it is an object of the present invention to provide a method of manufacturing an organic EL display having high manufacturing yield and low production cost.

Additional objects and advantages of the invention will be set forth in part in the description which follows and, in part, will be obvious from the description, or may be learned by practice of the invention.

In order to achieve the above and other objects, the present invention provides a method of manufacturing an organic EL display including a pixel region and a non-pixel region, the pixel region including a plurality of pixels, each pixel including at least two thin film transistors (TFTs), the non-pixel region including at least two TFTs having different conductive-types. The method includes a) depositing sequentially a transparent material layer and a first metal layer on a substrate; b) patterning simultaneously the transparent material layer and the first metal layer to form a pixel electrode, a first capacitor electrode, first and second source and drain electrodes on the pixel region, and first- and second-type source and drain electrodes on the non-pixel region; c) forming first and second semiconductor layers between the first and second source and drain electrodes, and first- and second-type semiconductor layers between the first- and second-type source and drain electrodes, respectively; d) forming an insulating layer having contact holes over the substrate; e) depositing a second metal layer over the whole surface of the substrate; f) patterning the second metal layer to form first and second gate electrodes and a first-type gate electrode, a second capacitor electrode, a first impurity shielding layer, the first impurity shielding layer formed over the second-type semiconductor layer; g) ion-implanting a first conductive type impurity to form first and second source and drain regions and first-type source and drain regions, respectively, on both end portions of the first and second semiconductor layer and the first-type semiconductor layer; h) depositing a second impurity shielding layer over the whole surface of the substrate; i) patterning the first impurity shielding layer and a portion of the second impurity shielding layer to form a second-type gate electrode; j) ion-implanting a second conductive type impurity to form second-type source and drain regions on both end portions of the second-type semiconductor layer; k) forming a planarization layer to expose a portion of the pixel electrode; and l) forming an EL light-emitting layer on the exposed portion of the pixel electrode.

The first and second conductive type impurities are p- and n-type impurities, respectively, so that the TFTs on the non-pixel region are PMOS and NMOC TFTs. The first capacitor electrode is electrically connected to the first drain electrode and the second gate electrode, and the second capacitor electrode is electrically connected to the second source electrode. The method further includes forming a buffer layer between the substrate and the transparent material layer before the step (a). The buffer layer comprises $SiO_2$. The pixel electrode is made of an indium tin oxide or indium zinc oxide. The planarization layer comprises acryl. The second impurity shielding layer is made of metal or photoresist.

Using the process of manufacturing the CMOS TFT AM-OELD according to the present invention, a manufacturing process is simplified, thereby leading to high manufacturing yield and low production cost.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF THE PREFERRED EMBODIMENTS

Reference will now be made in detail to preferred embodiments of the present invention, example of which is illustrated in the accompanying drawings.

Figure 1:
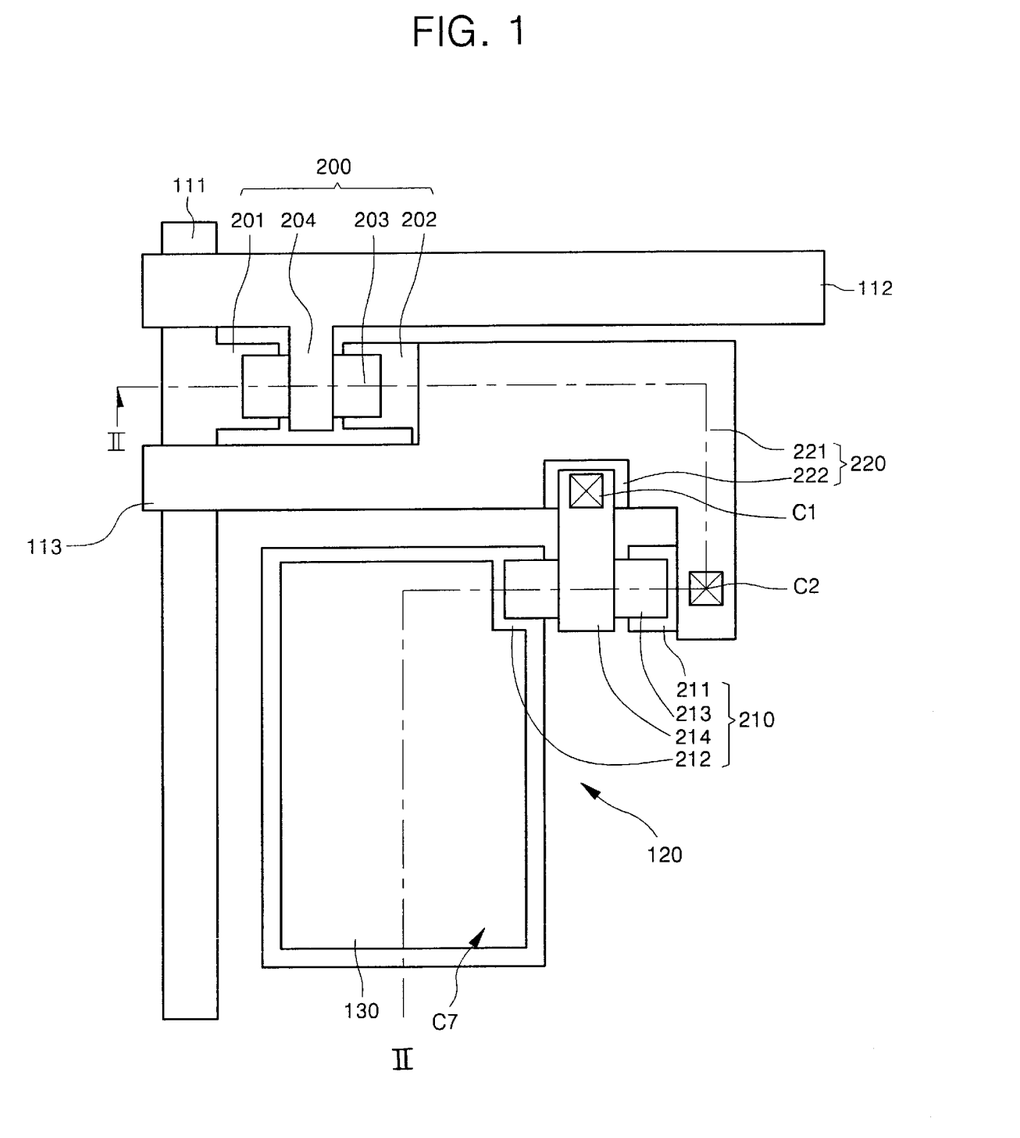
FIG. 1 is a plan view illustrating an organic EL display device according to an embodiment of the present invention.

FIG. 1 is a plan view illustrating an organic EL display (OELD) device according to an embodiment of the present invention. The OELD device includes a pixel region and a non-pixel region. The pixel region includes a plurality of pixels 120 arranged in the form of a matrix.

FIG. 1 shows one pixel of the OELD. Each pixel includes at least two thin film transistors (see 200 and 210 in FIG. 1). Also, at least two TFTs (see 250 and 260 FIG. 3F) having different conductive-types are formed on the non-pixel region. Each of the pixels 120 includes gate lines 112 arranged in a transverse direction and data lines 111 arranged in a longitudinal direction perpendicular to the gate lines 112.

A switching thin film transistor (TFT) 200 is formed near a crossing point of the gate line 112 and the data line 111. The switching TFT 200 includes a source electrode 201, a drain electrode 202, a semiconductor layer 203, and a gate electrode 204. The source electrode 201 extends from the data line 111, and the gate electrode 204 extends from the gate line 112.

A storage capacitor 220 is formed near the switching TFT 200. The storage capacitor 220 includes first and second capacitor electrodes 222 and 221 with a dielectric layer 223 (see FIG. 2F) interposed therebetween. The first capacitor electrode 222 extends from the drain electrode 202 of the switching TFT 200.

A driving TFT 210 is formed to drive an EL light-emitting layer (not shown). The driving TFT 210 includes a source electrode 211, a drain electrode 212, a semiconductor layer 213, and a gate electrode 214. The gate electrode 214 of the driving TFT 210 is connected to the first capacitor electrode 222 of the storage capacitor 220 through a contact hole C1. The source electrode 211 of the driving TFT 210 is connected to the second capacitor electrode 221 of the storage capacitor 220 through a contact hole C2.

A power applying line 113 is connected to the second electrode 221 of the storage capacitor 220.

Meanwhile, a transparent material layer made of indium tin oxide (ITO) or indium zinc oxide (IZO) is formed on portions of the substrate 100 corresponding to a first metal layer, that is, under the data line 111, the source and drain electrodes 201 and 202 of the switching TFT 200, the first capacitor electrode 222 of the storage capacitor 220, and the source and drain electrodes 211 and 212 of the driving TFT 210.

A light emitting hole C7 is formed to expose a portion of the transparent material layer in order to provide a region on which the EL light-emitting layer is formed.

Further, even though not shown, a controller is arranged to control signals provided to the data lines 111, the gate line 112 and the power applying line 113. The controller includes controller TFTs 250 and 260 (see FIGS. 3E and 3F).

FIGS. 2A to 2F are cross-sectional views taken along line I–II of FIG. 1. FIGS. 3A to 3F are cross-sectional views illustrating a process of forming the controller TFTs 250 and 260.

Hereinafter, a process of manufacturing the AM-OELD according to the embodiment of the present invention is explained with reference to FIGS. 2A to 2F and 3A to 3F.

Figure 2A:
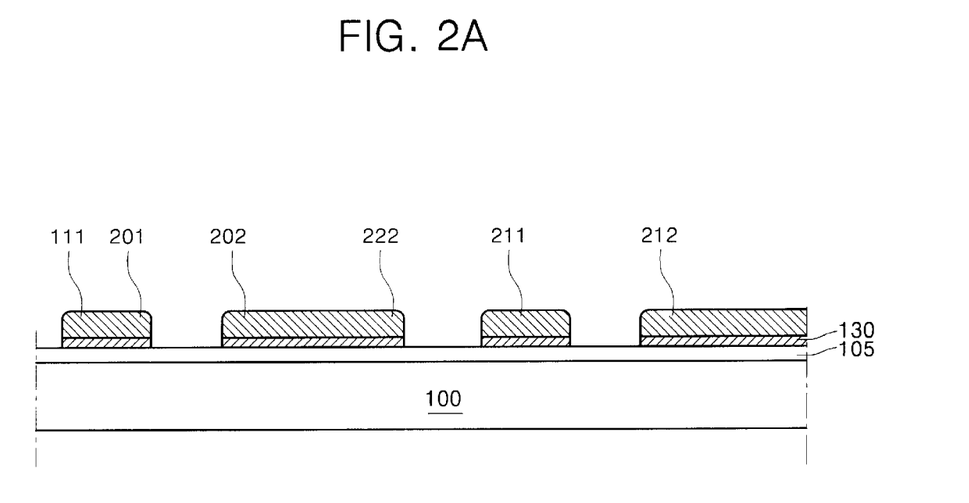
FIGS. 2A to 2F are cross-sectional views taken along line II—I of FIG. 1.
Figure 3A:
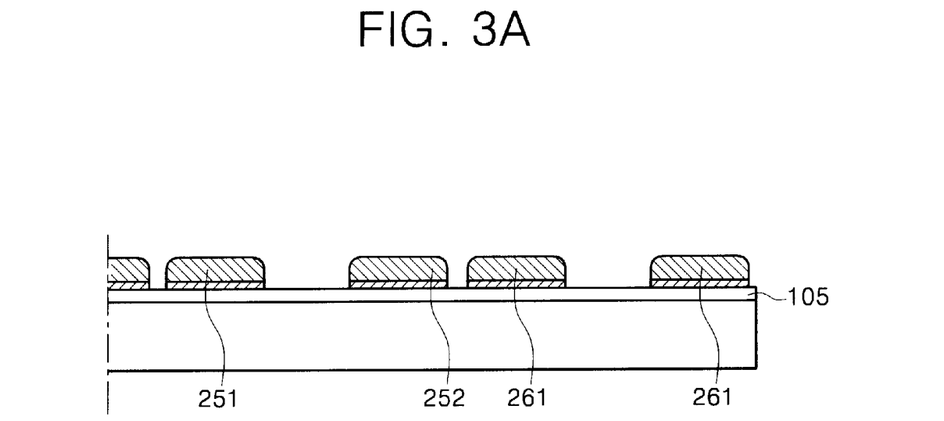
FIGS. 3A to 3F are cross-sectional views illustrating a process of forming controller TFTs.

First, as shown in FIGS. 2A and 3A, a buffer layer 105 is formed on the whole surface of the substrate 100. The buffer layer 105 is made of for example $SiO_2$.

Then, a transparent material layer and a first metal layer are sequentially deposited on the whole surface of the buffer layer 105 and then simultaneously patterned using a first mask to form the pixel electrode 130 and the data line 111, the source and drain electrodes 201 and 202 of the switching TFT 200, the source and drain electrodes 211 and 212 of the switching TFT 210, the first capacitor electrode 222 of the storage capacitor 220, the source and drain electrodes 251 and 252 of the controller TFT 250, and the source and drain electrodes 261 and 262 of the controller TFT 260. The pixel electrode 130 is made of ITO or IZO.

Figure 2B:
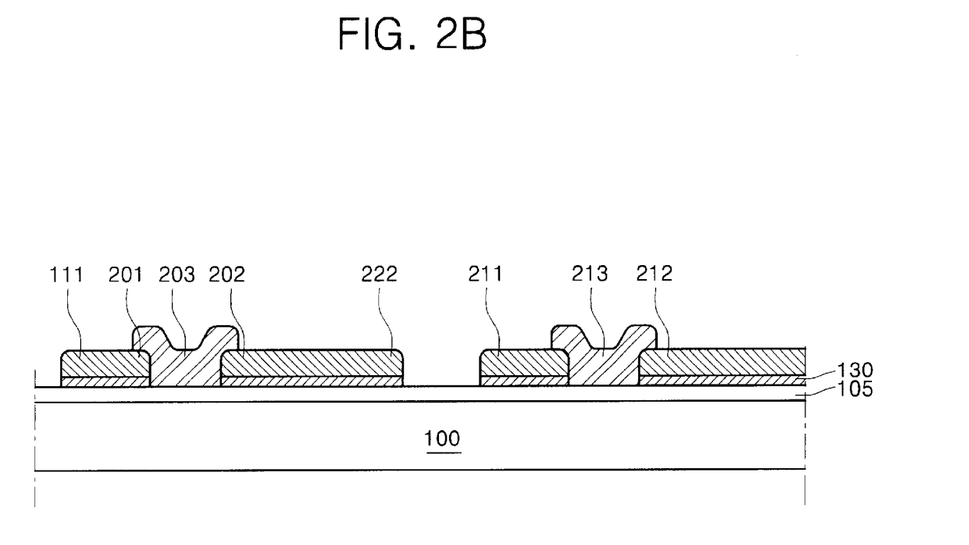
Figure 3B:
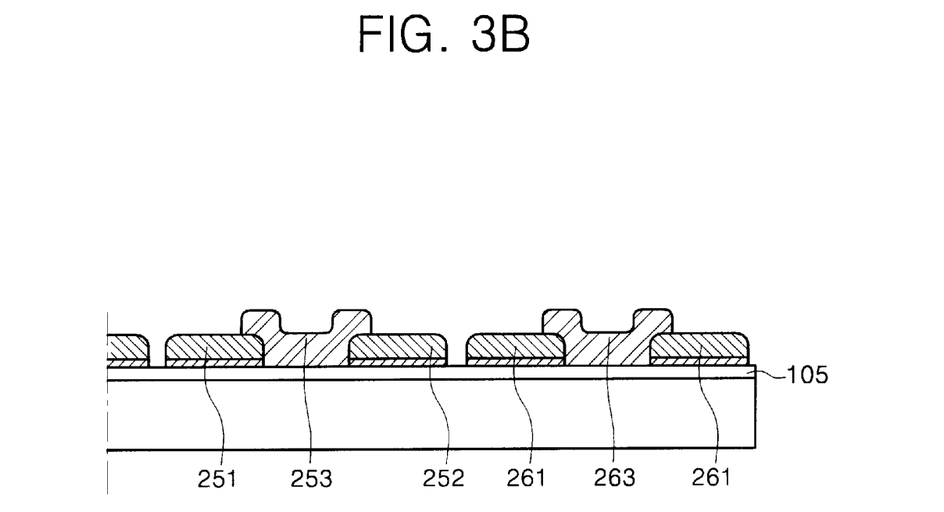

Thereafter, as shown in FIGS. 2B and 3B, an amorphous silicon layer is deposited over the substrate 100. The amorphous silicon layer is crystallized using, for example, a laser annealing technique to form a polycrystalline silicon layer. The polycrystalline silicon layer is patterned using a second mask to form the semiconductor layers 203, 213, 253 and 263 of the TFTs 200, 210, 250, and 260, respectively.

Figure 2C:
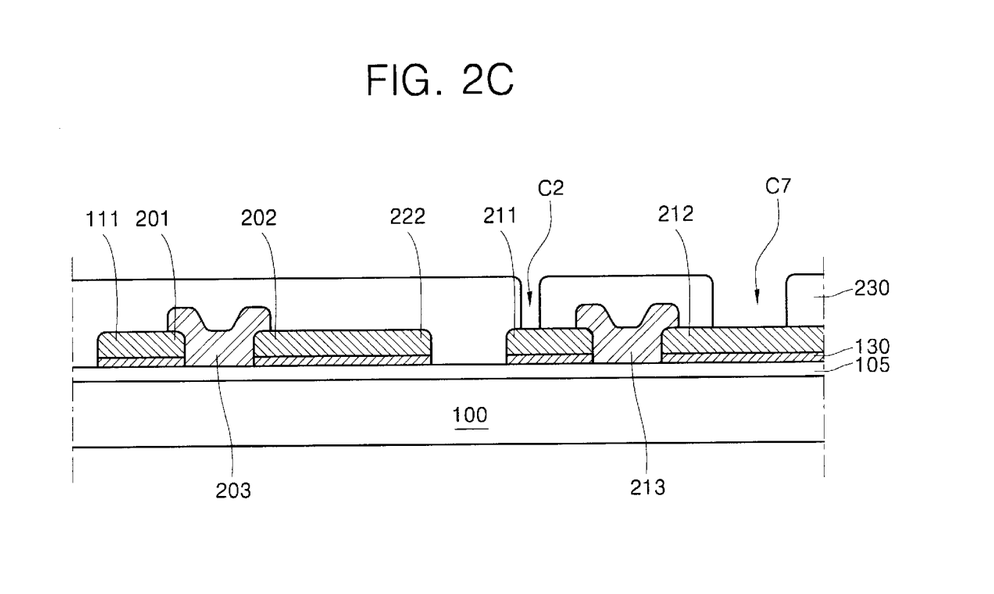
Figure 3C:
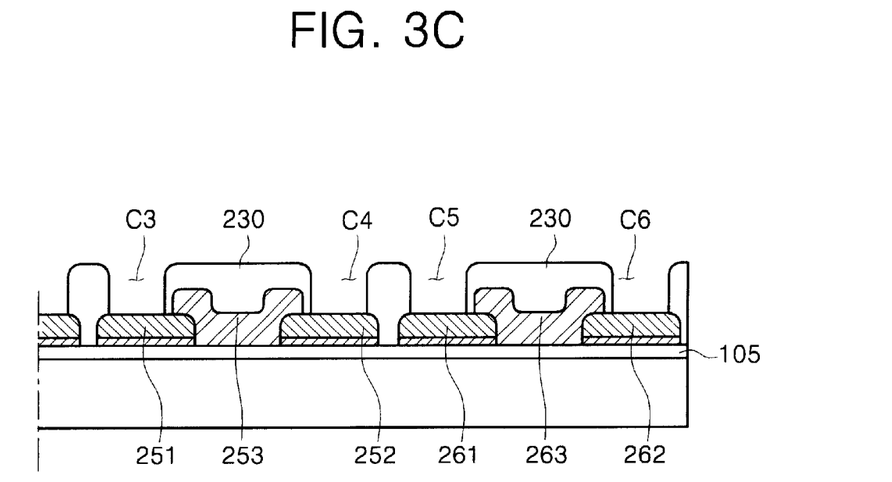

As shown in FIGS. 2C and 3C, an insulating material layer is deposited over the whole surface of the substrate 100 and patterned using a third mask to form an insulating layer 230. The insulating layer 230 includes contact holes C1, C2, C3, C4, C5, C6 and C7.

The contact hole C1 (see FIG. 1) is formed to expose a portion of the first capacitor electrode 222. The contact hole C2 is formed to expose a portion of the source electrode 211 of the driving TFT 210. The contact hole C3 is formed to expose a portion of the source electrode 251 of the TFT 250. The contact hole C4 is formed to expose a portion of the drain electrode 252 of the TFT 250. The contact hole C5 is formed to expose a portion of the source electrode 261 of the TFT 260. The contact hole C6 is formed to expose a portion of the drain electrode 262 of the TFT 260. The contact hole C7 (i.e., light emitting hole) is formed to expose a portion of the pixel electrode 130.

A portion of the insulating layer 230 between the first and second capacitor electrodes 222 and 221 of the storage capacitor 220 serves as the dielectric layer 223 of the storage capacitor 220.

Preferably, the insulating layer 230 is an oxidation layer.

Figure 2D:
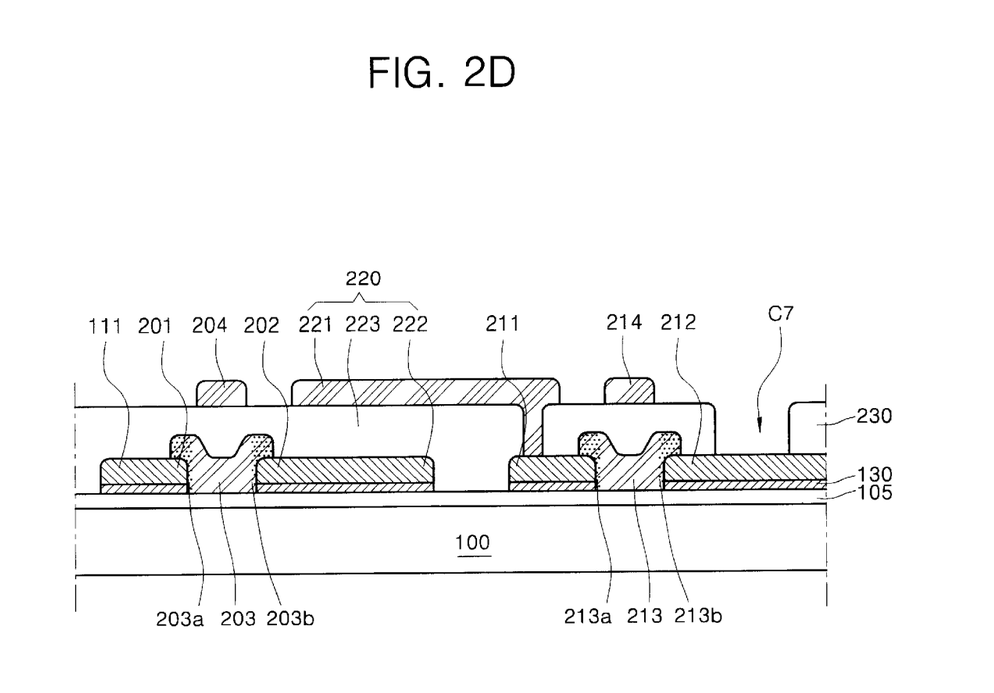
Figure 3D:
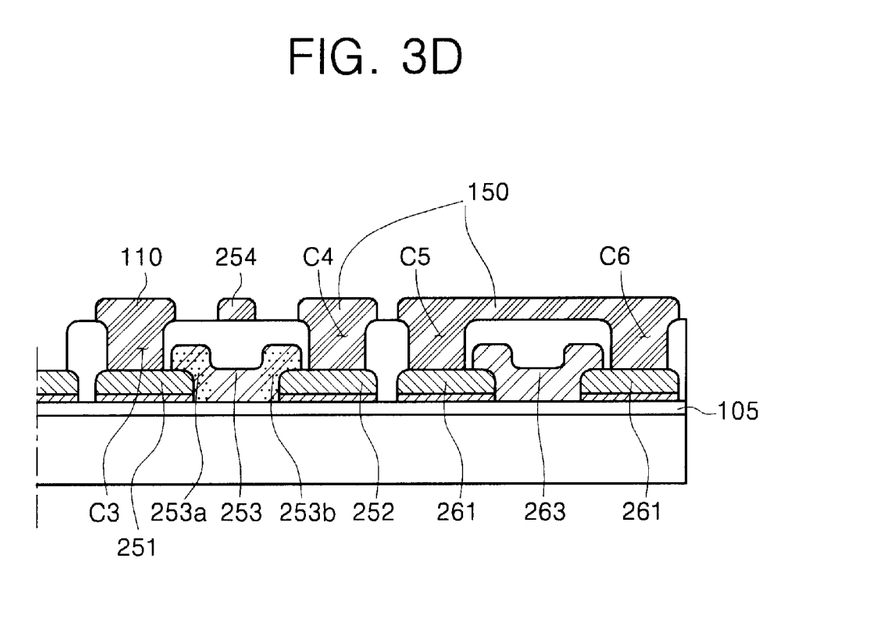

Subsequently, as shown in FIGS. 2D and 3D, a second metal layer is deposited over the whole surface of the substrate 100 and then patterned using a fourth mask to form the gate electrode 204 of the switching TFT 200, the power applying line 113, the second capacitor electrode 221 of the storage capacitor 220, the gate electrode 214 of the driving TFT 210, a signal line 110, and the gate electrode 254 of the PMOS TFT 250.

The second capacitor electrode 221 of the storage capacitor 220 is connected to the source electrode 211 of the driving TFT 210 through the contact hole C2. The power applying line 113 extends from the second capacitor electrode 221 of the storage capacitor 220.

The signal line 110 is connected to the source electrode 251 of the PMOS TFT 250 through the contact hole C3.

Also, a portion 150 of the second metal layer corresponding to the drain electrode 252 of the PMOS TFT 250 and the entire NMOS TFT 260 is not patterned. That is, the non-patterned portion 150 of the second metal layer covers the whole surface of the NMOS TFT 260 and fills the contact hole C4.

Thereafter, a p-type impurity is ion-implanted to form source and drain regions 203a and 203b of the switching TFT 200 and source and drain regions 213a and 213b of the driving switching TFT 210. At this point, the non-patterned portion 150 of the second metal layer serves as a mask that shields an impurity.

Figure 2E:
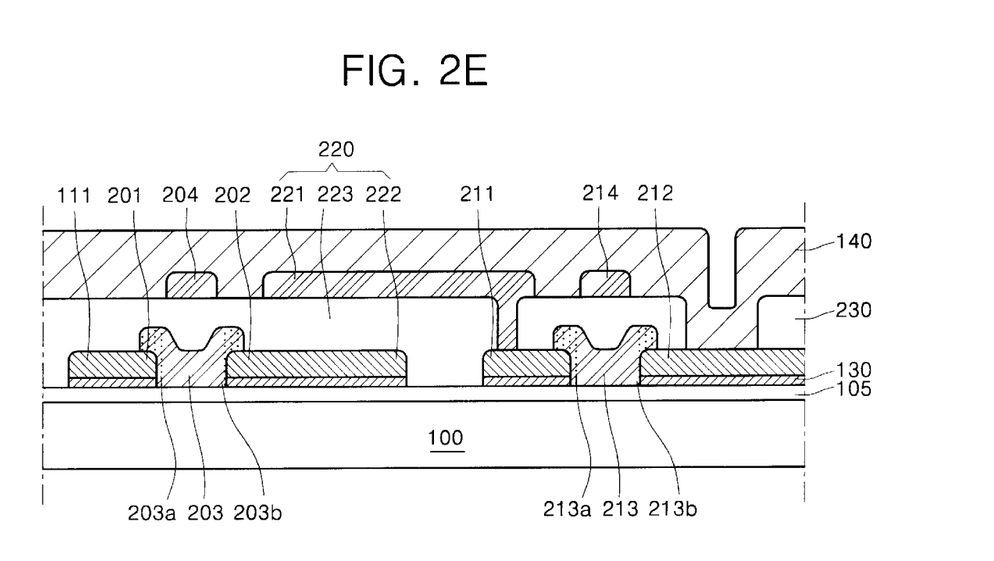
Figure 3E:
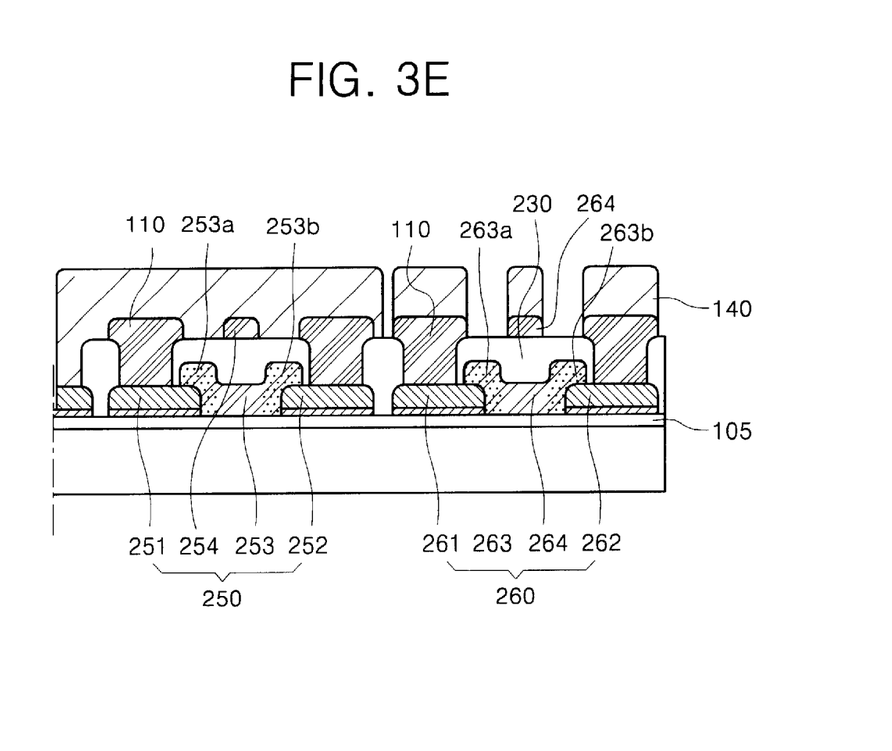

Next, as shown in FIGS. 2E and 3E, a third metal layer 140 is deposited over the whole surface of the substrate 100. Using a fifth mask, the portion 150 of the second metal layer and the third metal layer 140 are simultaneously patterned to form the gate electrode 264 of the NMOS TFT 260.

Subsequently, an n-type impurity is ion-implanted to form source and drain region 263a and 263b of the NMOS TFT 260. Then, the third metal layer 140 and the first metal layer under the light emitting hole C7 are removed. At this point, instead of the third metal layer 140, a photoresist can be used to shield an impurity. However, the metal layer is more efficient in shielding an impurity than the photoresist.

The fourth mask process is not required when the TFTs 200, 210, and 250 are all NMOS TFTs. Also, the fifth mask process is not required when the TFT 260 is a PMOS TFT.

Figure 2F:
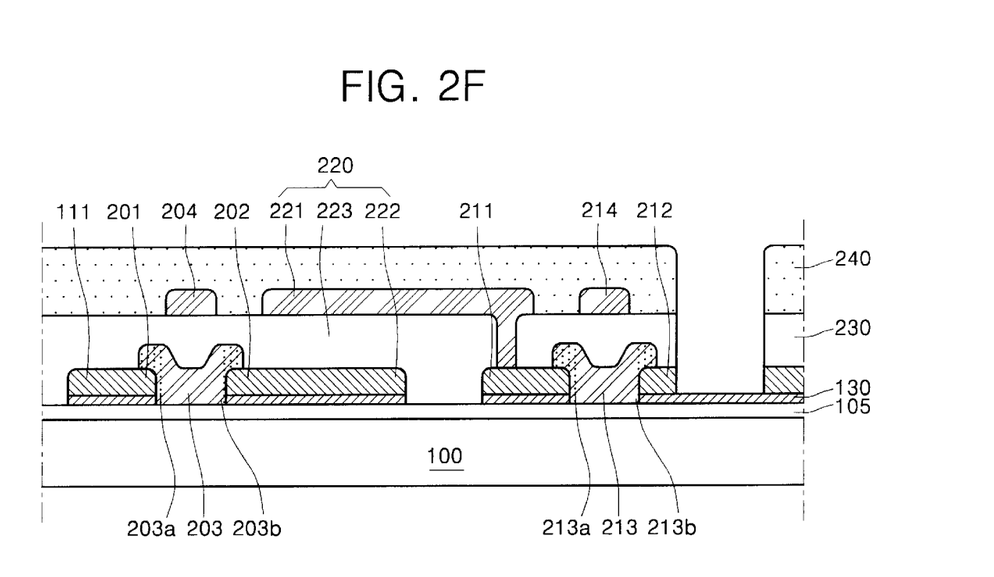
Figure 3F:
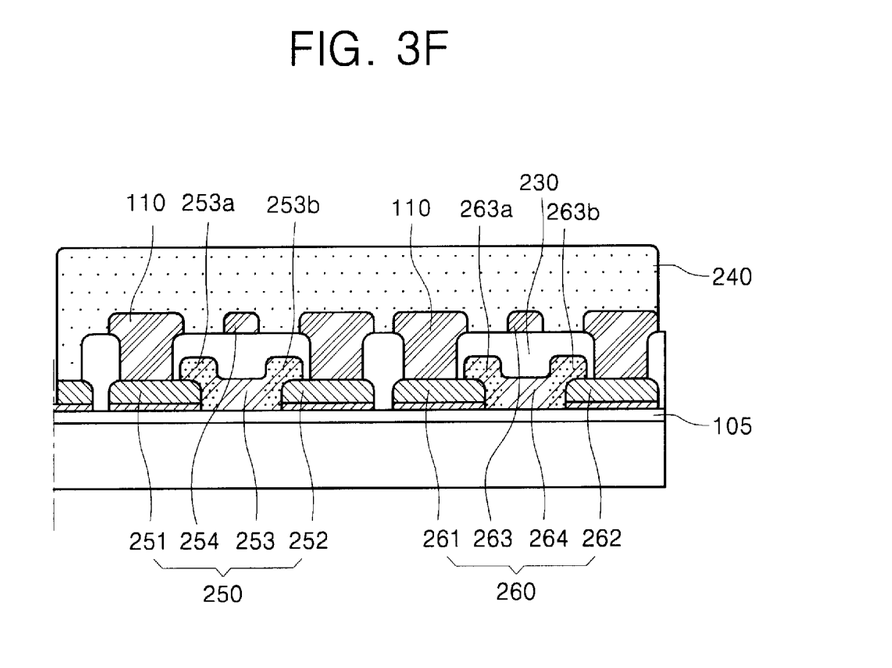

As shown in FIGS. 2F and 3F, a second insulating material layer is deposited over the whole surface of the substrate 100 and then patterned using a sixth mask to form a planarization layer 240 and to expose a portion of the pixel electrode 130 on which the EL light-emitting layer will be formed. The planarization layer is made of acryl.

Finally, even though not shown, the EL light-emitting layer and the cathode layer are formed on the exposed portion of the pixel electrode 130. The EL light-emitting layer includes an electron injection layer, an electron transfer layer, an emission material layer, a hole transfer layer, and a hole injection layer.

As described herein before, using the process of manufacturing the CMOS TFT AM-OELD according to the embodiment of the present invention, a manufacturing process is simplified, thereby leading to high manufacturing yield and low production cost.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing an organic EL display including a pixel region and a non-pixel region, the pixel region including a plurality of pixels, each pixel including at least two thin film transistors (TFTs), the non-pixel region including at least two TFTs having different conductive-types, the method comprising:

depositing sequentially a transparent material layer and a first metal layer on a substrate;

patterning simultaneously the transparent material layer and the first metal layer to form a pixel electrode, a first capacitor electrode, first and second source and drain electrodes on the pixel region, and first- and second-type source and drain electrodes on the non-pixel region;

forming first and second semiconductor layers between the first and second source and drain electrodes, and first- and second-type semiconductor layers between the first- and second-type source and drain electrodes, respectively;

forming an insulating layer having contact holes over the substrate;

depositing a second metal layer over the whole surface of the substrate;

patterning the second metal layer to form first and second gate electrodes and a first-type gate electrode, a second capacitor electrode, a first impurity shielding layer, the first impurity shielding layer formed over the second-type semiconductor layer;

ion-implanting a first conductive type impurity to form first and second source and drain regions and first-type source and drain regions, respectively on both end portions of the first and second semiconductor layer and the first-type semiconductor layer;

depositing a second impurity shielding layer over the whole surface of the substrate;

patterning the first impurity shielding layer and a portion of the second impurity shielding layer to form a second-type gate electrode;

ion-implanting a second conductive type impurity to form second-type source and drain regions on both end portions of the second-type semiconductor layer;

forming a planarization layer to expose a portion of the pixel electrode; and forming an EL light-emitting layer on the exposed portion of the pixel electrode.

2. The method of claim 1, wherein the first and second conductive type impurities are p- and n-type impurities, respectively, so as to produce the TFTs on the non-pixel region as PMOS and NMOS TFTs.

3. The method of claim 1, wherein the first capacitor electrode is electrically connected to the first drain electrode and the second gate electrode, and the second capacitor electrode is electrically connected to the second source electrode.

4. The method of claim 1, further comprising, forming a buffer layer on the substrate before the depositing sequentially of the transparent material layer and the first metal layer on the substrate.

5. The method of claim 4, wherein the buffer layer comprises $SiO_2$.

6. The method of claim 1, wherein the pixel electrode is made of an indium tin oxide or indium zinc oxide.

7. The method of claim 1, wherein the planarization layer comprises acryl.

8. The method of claim 1, wherein the second impurity shielding layer is made of metal or photoresist.

9. A method of manufacturing an organic EL display including a pixel region and a non-pixel region, the pixel region including a plurality of pixels, the method comprising:

depositing a transparent material layer and a first metal layer sequentially on a substrate, and simultaneously patterning the transparent material layer and the first metal layer using a first mask to form a pixel electrode, a first capacitor electrode of a storage capacitor, first and second source and drain electrodes of switching and driving thin film transistors (TFTs) on the pixel region, and first- and second-type source and drain electrodes of first and second controller TFTs on the non-pixel region;

depositing a silicon layer over the substrate, and patterning the silicon layer using a second mask to form semiconductor layers between the corresponding first and second source and drain electrodes, and the corresponding first- and second-type source and drain electrodes;

depositing an insulating layer over the substrate, and patterning the insulating layer using a third mask to form contact holes;

depositing a second metal layer over the substrate, and patterning the second metal layer using a fourth mask to form gate electrodes of the switching and driving TFrs, a power applying line, a second capacitor electrode of the storage capacitor, a first-type gate electrode, a first impurity shielding layer, wherein the first impurity shielding layer is formed over the semiconductor layer between the second-type source and drain electrodes;

ion-implanting a first conductive type impurity to form first and second source and drain regions on end portions of the semiconductor layers between the corresponding first and second source and drain electrodes, and first-type source and drain regions on end portions of the semiconductor layer between the first-type source and drain electrodes, while shielding the second-type source and drain electrodes with the first impurity shielding layer;

depositing a second impurity shielding layer over the substrate, and patterning the first impurity shielding layer and a portion of the second impurity shielding layer using a fifth mask to form a second-type gate electrode of the second controller TFT;

ion-implanting a second conductive type impurity to form second-type source and drain regions on end portions of the semiconductor layer between the second-type source and drain electrodes;

depositing a second insulating layer over the substrate, and patterning the second insulating layer using a sixth mask to form a planarization layer to expose a portion of the pixel electrode; and forming an EL light-emitting layer on the exposed portion of the pixel electrode.

10. The method of claim 9, wherein the second impurity shielding layer is a metal layer.

11. The method of claim 9, wherein the second impurity shielding layer is a photoresist.

12. The method of claim 9, wherein the first capacitor electrode extends from the drain electrode of the shifting TFT.

13. The method of claim 9, wherein the depositing of the second metal layer comprises:

depositing an amorphous silicon layer over the substrate;

crystallizing the amorphous silicon layer to form a crystalline silicon layer; and patterning the crystalline silicon layer.

14. The method of claim 9, wherein the contact holes expose portions of the first capacitor electrode, the source electrode of the driving TFT, the source electrode of the first controller TFT, the drain electrode of the first controller TFT, the source electrode of the second controller TFT, the drain electrode of the second controller TFT and the pixel electrode.

15. The method of claim 10, wherein the second capacitor electrode is connected to the source electrode of the driving TFT through a first one of the contact holes, the power applying line extends from the second capacitor electrode, and a signal line is connected to the source electrode of the first controller TFT through a second one of the contact holes.

* * * * *